United States Patent
Linkov et al.

(10) Patent No.: US 10,115,871 B2
(45) Date of Patent: Oct. 30, 2018

(54) OPTOELECTRONIC SEMICONDUCTOR COMPONENT AND METHOD FOR PRODUCING SAME

(71) Applicant: OSRAM Opto Semiconductors GmbH, Regensburg (DE)

(72) Inventors: Alexander Linkov, Regensburg (DE); Siegfried Herrmann, Neukirchen (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 20 days.

(21) Appl. No.: 15/543,665

(22) PCT Filed: Dec. 16, 2015

(86) PCT No.: PCT/EP2015/080033
§ 371 (c)(1),
(2) Date: Jul. 14, 2017

(87) PCT Pub. No.: WO2016/119973
PCT Pub. Date: Aug. 4, 2016

(65) Prior Publication Data
US 2018/0006196 A1   Jan. 4, 2018

(30) Foreign Application Priority Data
Jan. 27, 2015   (DE) .......... 10 2015 101 143

(51) Int. Cl.
*H01L 33/50* (2010.01)
*H01L 33/60* (2010.01)
(Continued)

(52) U.S. Cl.
CPC .......... *H01L 33/504* (2013.01); *H01L 33/508* (2013.01); *H01L 33/60* (2013.01);
(Continued)

(58) Field of Classification Search
CPC .......... H01L 33/504; H01L 33/508
(Continued)

(56) References Cited

U.S. PATENT DOCUMENTS

| 6,730,939 B2 | 5/2004 | Eisert et al. |
| 9,559,266 B2 | 1/2017 | Wirth et al. |

(Continued)

FOREIGN PATENT DOCUMENTS

| DE | 10006738 A1 | 9/2001 |
| DE | 102011087886 A1 | 6/2013 |

(Continued)

*Primary Examiner* — David Vu
*Assistant Examiner* — Brandon Fox
(74) *Attorney, Agent, or Firm* — Slater Matsil, LLP

(57) ABSTRACT

An optoelectronic semiconductor component and a method for producing the same are disclosed. In an embodiment the semiconductor component includes a semiconductor chip, which emits electromagnetic radiation of a first wavelength range from a radiation emission surface. The semiconductor component further includes a first conversion layer located on a lateral flank of the semiconductor chip, wherein the first conversion layer is suitable for converting electromagnetic radiation of the first wavelength range into electromagnetic radiation of a second wavelength range, and a second conversion layer located on the radiation emission surface of the semiconductor chip, wherein the second conversion layer is suitable for converting electromagnetic radiation of the first wavelength range into electromagnetic radiation of the second or of a third wavelength range. The first conversion layer is different from the second conversion layer.

16 Claims, 9 Drawing Sheets

(51) Int. Cl.
  *H01L 23/00* (2006.01)
  *H01L 33/62* (2010.01)
  *H01L 33/56* (2010.01)
(52) U.S. Cl.
  CPC .............. *H01L 24/96* (2013.01); *H01L 33/56* (2013.01); *H01L 33/62* (2013.01); *H01L 2224/04105* (2013.01); *H01L 2224/19* (2013.01); *H01L 2224/96* (2013.01); *H01L 2933/005* (2013.01); *H01L 2933/0033* (2013.01); *H01L 2933/0041* (2013.01); *H01L 2933/0058* (2013.01); *H01L 2933/0066* (2013.01)
(58) Field of Classification Search
  USPC ...................................................... 257/88, 98
  See application file for complete search history.

(56) References Cited

U.S. PATENT DOCUMENTS

| | | | |
|---|---|---|---|
| 9,590,151 | B2 | 3/2017 | Richter et al. |
| 2003/0214233 | A1 | 11/2003 | Takahashi et al. |
| 2008/0238335 | A1* | 10/2008 | Lee .................... H05B 33/0869 |
| | | | 315/294 |
| 2011/0147778 | A1 | 6/2011 | Ichikawa |
| 2011/0198780 | A1* | 8/2011 | Basin ...................... H01L 33/50 |
| | | | 264/266 |
| 2013/0062648 | A1* | 3/2013 | Nishimura ............ H01L 33/504 |
| | | | 257/98 |
| 2013/0193465 | A1 | 8/2013 | Xu et al. |
| 2014/0048824 | A1* | 2/2014 | Hsieh ...................... H01L 33/50 |
| | | | 257/88 |
| 2014/0203306 | A1* | 7/2014 | Ito ......................... H01L 33/505 |
| | | | 257/88 |
| 2014/0231850 | A1* | 8/2014 | Tischler ................ H01L 33/502 |
| | | | 257/98 |
| 2014/0264412 | A1* | 9/2014 | Yoon ..................... H01L 33/465 |
| | | | 257/98 |
| 2015/0318451 | A1* | 11/2015 | Ishida .................. C09K 11/7734 |
| | | | 257/98 |
| 2015/0357530 | A1 | 12/2015 | Albrecht et al. |
| 2016/0027971 | A1* | 1/2016 | Anc ....................... H01L 33/508 |
| | | | 257/98 |

FOREIGN PATENT DOCUMENTS

| | | |
|---|---|---|
| DE | 102012216552 A1 | 3/2014 |
| DE | 102013100711 A1 | 7/2014 |
| DE | 102013207611 A1 | 10/2014 |
| DE | 102014108368 A1 | 12/2015 |
| DE | 102015102460 A1 | 8/2016 |
| DE | 102015102699 A1 | 8/2016 |
| DE | 102015107586 A1 | 11/2016 |
| DE | 102015107588 A1 | 11/2016 |
| DE | 102015107590 A1 | 11/2016 |
| DE | 102015109852 A1 | 12/2016 |
| JP | 2009182241 A | 8/2009 |
| WO | 2014170271 A1 | 10/2014 |

* cited by examiner

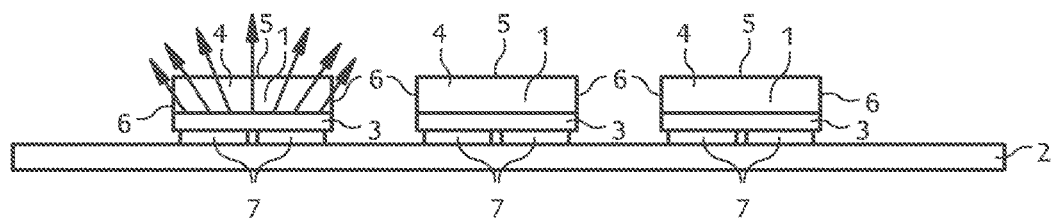
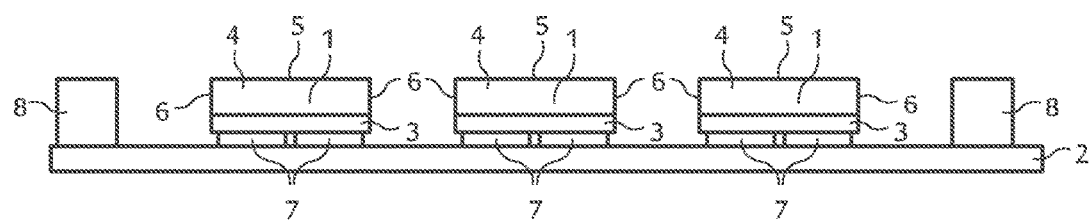
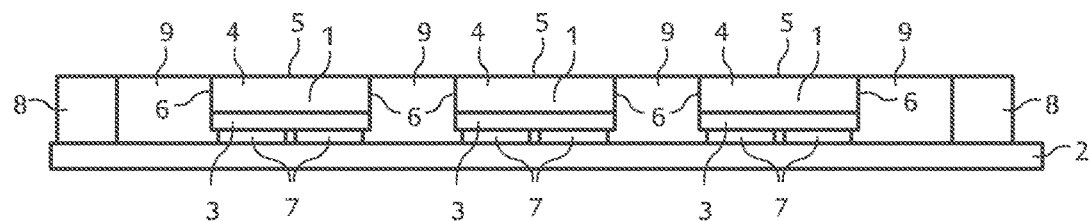

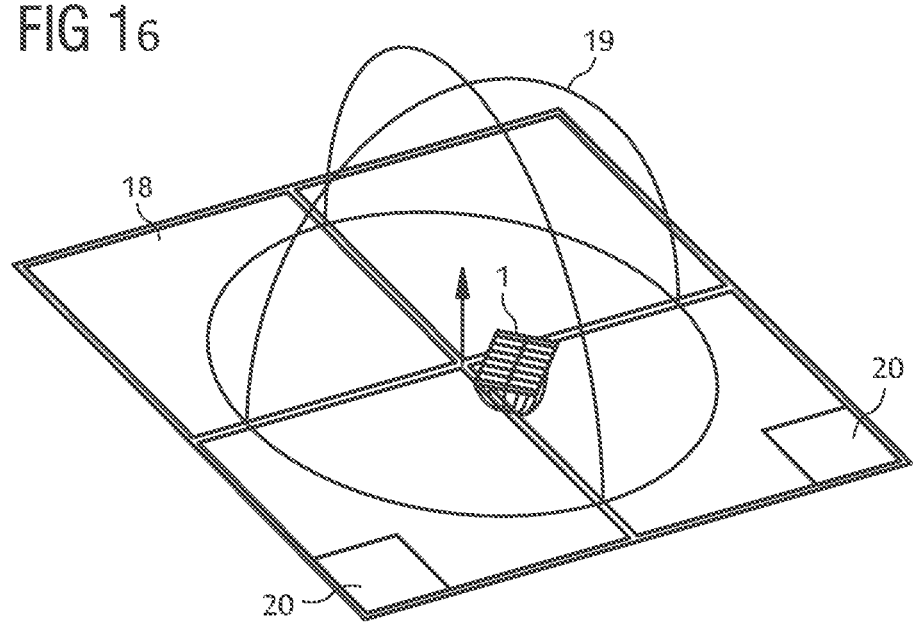
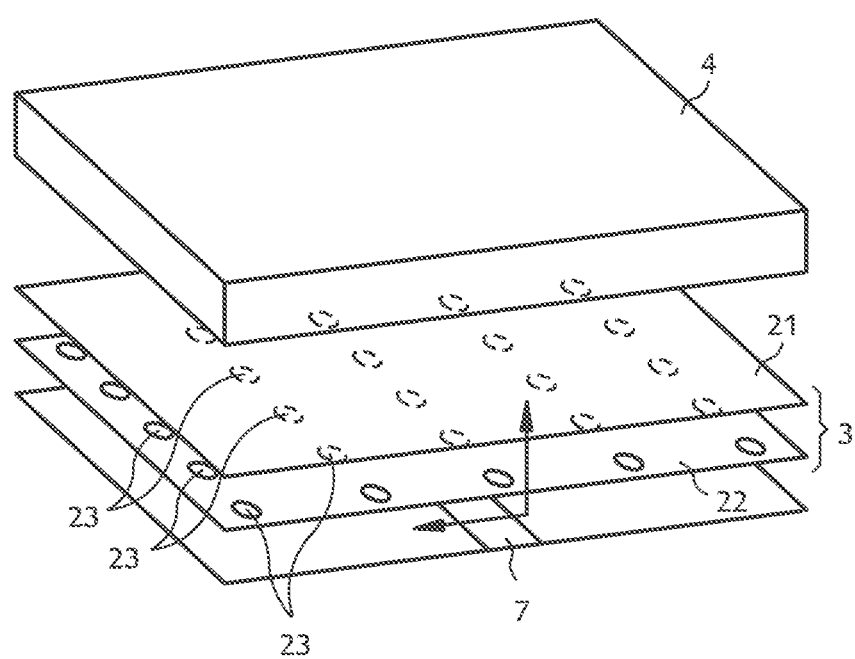

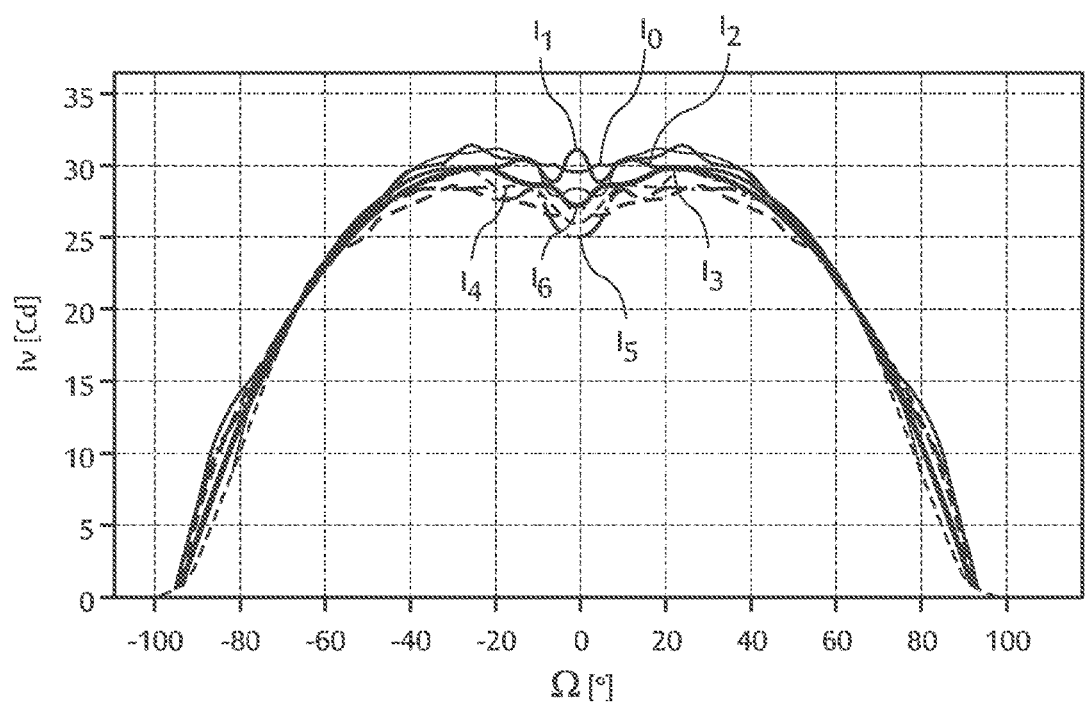

OPTOELECTRONIC SEMICONDUCTOR COMPONENT AND METHOD FOR PRODUCING SAME

This patent application is a national phase filing under section 371 of PCT/EP2015/080033, filed Dec. 16, 2015, which claims the priority of German patent application 10 2015 101 143.3, filed Jan. 27, 2015, each of which is incorporated herein by reference in its entirety.

TECHNICAL FIELD

A method for producing a plurality of optoelectronic semiconductor components and an optoelectronic semiconductor component are provided. Furthermore, a method for simulating a semiconductor component having improved emission characteristics is provided. In particular, the homogeneity of the color impression across the angle should be improved.

BACKGROUND

A method for producing a plurality of optoelectronic semiconductor components is described, e.g., in the document WO 2014/170271 A1.

SUMMARY OF THE INVENTION

Embodiments of the invention provide an optoelectronic semiconductor component having improved emission characteristics. In various embodiments of the inventions the color of the emitted light is homogenized as a function of the viewing angle.

In various further embodiments a method for producing an optoelectronic semiconductor component is provided, wherein the optoelectronic component emits light which has a color that is as uniform as possible depending of the viewing angle.

In further embodiments the method for producing a plurality of optoelectronic semiconductor components includes providing a plurality of semiconductor chips which emit radiation of a first wavelength range from a radiation exit surface. Particularly preferably, the first wavelength range includes blue light or is formed from blue light.

The semiconductor chips are applied onto an auxiliary carrier. The auxiliary carrier comprises, e.g., a metal plate, onto which a double-sided adhesive film is laminated. The semiconductor chips can be fixed on the double-sided adhesive film.

A first conversion material is then applied into interstices between the semiconductor chips. The first conversion material is suitable for converting electromagnetic radiation of the first wavelength range into electromagnetic radiation of a second wavelength range, which differs from the first wavelength range. The second wavelength range can include visible green light to infrared light. For example, the first conversion material is suitable for converting blue light from the semiconductor chip into yellow light.

In other words, the first conversion material is designed to be wavelength-converting. The term "wavelength-converting" means in the present case in particular that incident electromagnetic radiation of a particular wavelength range is converted into electromagnetic radiation of another, preferably longer, wavelength range. A wavelength-converting element generally absorbs electromagnetic radiation of an incident wavelength range, converts it by electronic processes at an atomic and/or molecular level into electromagnetic radiation of another wavelength range and emits the converted electromagnetic radiation again. In particular, pure scattering or pure absorption is not meant by "wavelength-converting".

Over the first conversion material a second conversion material is applied. The second conversion material is suitable for converting electromagnetic radiation of the first wavelength range into electromagnetic radiation of the second wavelength range or of a third wavelength range, wherein the third wavelength range preferably differs from the first wavelength range and the second wavelength range. It is also possible that the first wavelength range and the third wavelength range are the same.

According to one embodiment of the method, the auxiliary carrier is removed again.

According to a further embodiment of the method, the semiconductor components are singulated, e.g., by sawing. The first conversion material forms a first conversion layer on the lateral flanks of the semiconductor chip and the second conversion material forms a second conversion layer on the radiation exit surface of the semiconductor chip in the finished semiconductor components. Particularly preferably, the first conversion layer differs from the second conversion layer. In this way, the color of the light emitted by the semiconductor chip can be adjusted to be particularly homogeneous as a function of the viewing angle.

According to one embodiment of the method, before applying the first conversion material a barrier is applied around the semiconductor chips in a marginal region of the auxiliary carrier. Preferably, the barrier forms a closed mold around the semiconductor chips. For example, the barrier is in the form of a closed ring around the semiconductor chips on the auxiliary carrier. The barrier can be formed from silicone or can contain a silicone, for example.

According to a further embodiment of the method, the first conversion material is a liquid resin into which phosphor particles have been introduced. The phosphor particles impart the wavelength-converting properties to the first conversion material. The resin can be, e.g., a silicone. The resin is cured before singulation.

The first conversion material can be introduced between the semiconductor chips in liquid form, e.g., by dispensing or pouring.

The barrier is particularly preferably configured to form a dam for the liquid first conversion material and to prevent the conversion material from flowing down from the auxiliary carrier.

According to a further embodiment of the method, the second conversion material is also a liquid resin into which phosphor particles have been introduced, which impart the wavelength-converting properties to the second conversion material. The resin is again cured before singulation.

For the phosphor particles, e.g., one of the following materials is suitable: rare-earth-doped garnets, rare-earth-doped alkaline earth sulfides, rare-earth-doped thiogallates, rare-earth-doped aluminates, rare-earth-doped silicates, rare-earth-doped orthosilicates, rare-earth-doped chlorosilicates, rare-earth-doped alkaline earth silicon nitrides, rare-earth-doped oxynitrides, rare-earth-doped aluminum oxynitrides, rare-earth-doped silicon nitrides, rare-earth-doped sialons.

The second conversion material can be applied onto the first conversion material and onto the radiation exit surfaces of the semiconductor chips over the entire surface in liquid form, e.g., by spray-coating.

The second conversion material can be applied in liquid form on to the likewise liquid first conversion material. In this case, phosphor particles from the second conversion material particularly preferably sediment in a targeted manner into the first conversion material in that no further processing of the composite of semiconductor chips and liquid conversion materials takes place for a while. As a result of the sedimentation, a concentration gradient can be established in a targeted manner along the lateral flank of the semiconductor chips, which leads to a particularly homogeneous color impression of the light emitted by the finished semiconductor component.

According to a further embodiment of the method, the second conversion material is prepared as a conversion film and laminated on to the main surface of the composite of semiconductor chips and first conversion material facing away from the auxiliary carrier over the entire surface. The laminating takes place, e.g., with exposure to elevated pressure and/or temperature. In this embodiment of the method, the first conversion material is particularly preferably cured before applying the conversion film. The conversion film can be formed, e.g., by a silicone film into which phosphor particles have been introduced, wherein the phosphor particles impart the wavelength-converting properties to the conversion film.

According to a further embodiment of the method, before applying the first conversion material a reflective material is applied into the interstices between the semiconductor chips. Particularly preferably, the reflective material is applied onto the auxiliary carrier in direct contact therewith. For example, the reflective material is likewise a resin into which reflective particles have been introduced which impart the reflective properties to the reflective material. The reflective particles can be, e.g., titanium oxide particles and the resin can be a silicone.

For example, the reflective material is initially provided in liquid form and is introduced into the interstices between the semiconductor chips by dispensing or pouring. In the further method, the reflective material is then cured so that a reflective layer is at least partially formed on the lateral flank of the semiconductor chip.

According to a further embodiment of the method, the auxiliary carrier is removed so that a back contact structure of the semiconductor chip is freely accessible. The contact structure is then expanded laterally by applying a metallic structure. The metallic structure can be applied, e.g., by means of photolithography or by printing a metal paste. Suitable printing methods are, e.g., screen-printing or stencil printing.

According to a further embodiment of the method, geometric outcoupling structures are placed onto a main surface of the second conversion material facing away from the radiation exit surfaces of the semiconductor chip. The outcoupling structures are suitable for improving radiation outcoupling from the semiconductor chip.

According to a further embodiment of the method, a translucent layer is applied onto the second conversion layer which, as a result of the singulating step, is structured on the lateral flanks obtained during said step in such a way that the outcoupling from the semiconductor component is improved. For example, the translucent layer is beveled on the side surfaces.

The concentration of the phosphor particles in the resin of the first conversion material and/or in the resin of the first conversion layer is preferably between 0.1 wt. % and 60 wt. % inclusive.

The concentration of the phosphor particles in the resin of the second conversion material and/or in the resin of the second conversion layer is preferably between 0.1 wt. % and 70 wt. % inclusive.

If the first conversion material is formed by a resin into which phosphor particles have been introduced and the second conversion material is likewise formed by a resin into which phosphor particles have been introduced, the concentration of phosphor particles in the first resin and the phosphor particle concentration in the second resin can be determined by a simulation.

Preferably, the color temperature of the radiation emitted by the finished semiconductor component and the concentration of phosphor particles in the first conversion material are initially defined in the simulation. Starting from these values, the concentration of phosphor particles in the second conversion material is determined iteratively.

A semiconductor component comprises a semiconductor chip, which emits electromagnetic radiation of a first wavelength range from a radiation exit surface. On a lateral flank of the semiconductor chip a first conversion layer is arranged, which is suitable for converting electromagnetic radiation of the first wavelength range into electromagnetic radiation of a second wavelength range, which differs from the first wavelength range. On the radiation exit surface a second conversion layer is arranged, which is suitable for converting electromagnetic radiation of the first wavelength range into electromagnetic radiation of the second or of a third wavelength range, wherein the third wavelength range differs from the first wavelength range and the second wavelength range.

Particularly preferably, the first conversion layer differs from the second conversion layer. For example, the first conversion layer and the second conversion layer differ in the concentration of phosphor particles or in their thickness. Furthermore, it is also possible that the first conversion layer comprises a resin other than that of the second conversion layer. It is also possible that the first conversion layer comprises phosphor particles other than those of the second conversion layer. For example, the phosphor particles differ in their material composition. However, it is also possible that the phosphor particles of the first conversion layer are indeed formed from the same material as the phosphor particles of the second conversion layer but they have a different particle size.

Preferably, the first conversion layer has a thickness of between 50 micrometers and 300 micrometers inclusive.

Particularly preferably, the thickness of the first conversion layer varies only slightly over its entire area. Preferably, the thickness of the first conversion layer deviates from a mean value by no more than 20%, particularly preferably no more than 10%, over its entire extension.

Preferably, the second conversion layer has a thickness of between 10 micrometers and 300 micrometers inclusive.

Particularly preferably, the thickness of the second conversion layer varies only slightly over its entire area. Preferably, the thickness of the second conversion layer deviates from a mean value by no more than 20%, particularly preferably no more than 10%, over its entire extension.

In the semiconductor component, light that is emitted via the lateral flanks of the semiconductor chip is at least partially converted by the first conversion layer and light that is emitted from the radiation exit surface of the semiconductor chip is at least partially converted by the second conversion layer. The semiconductor component preferably emits mixed-colored light which is formed from unconverted light from the semiconductor chip and from light converted by the two conversion layers. Particularly preferably, this mixed-colored light has a color location in the white region of the CIE standard color chart.

Because of the different properties of the first conversion layer and second conversion layer, the color of the mixed-colored light can in particular be homogenized across the angle. If too little light emitted from the lateral flanks of the semiconductor chip is converted by the first conversion layer, a ring with the color of the light from the semiconductor chip, for example, blue, appears in an outer region of the emission cone from the semiconductor component. If, on the other hand, too much light emitted from the lateral flanks of the semiconductor chip is converted by the first conversion layer, a ring with the color of the converted light, for example, yellow, appears in an outer region of the emission cone from the semiconductor component. Such a color inhomogeneity in the emission characteristics can advantageously be at least reduced by the present concept.

In particular, the simulation described above allows the concentration of phosphor particles in the two conversion layers to be defined in such a way that a uniform color of a mixed-colored light emitted by the semiconductor component is achieved.

Particularly preferably, the semiconductor chip comprises a carrier, onto which an epitaxial semiconductor layer sequence with an active zone has been applied, which active zone generates electromagnetic radiation of the first wavelength range during operation. For example, the epitaxial semiconductor layer sequence comprises a p-doped semiconductor layer and an n-doped semiconductor layer, wherein the active zone is formed by the p-n junction of these two layers. The n-doped semiconductor layer generally borders the carrier.

The epitaxial semiconductor layer sequence is particularly preferably based on a nitride compound semiconductor material. Nitride compound semiconductor materials are compound semiconductor materials from the system $In_xAl_yGa_{1-x-y}N$ with $0 \leq x \leq 1$, $0 \leq y \leq 1$ and $x+y \leq 1$.

Between the epitaxial semiconductor layer sequence and the contact structures, a mirror layer is preferably formed, which is intended to guide radiation from the active zone to the radiation exit surface of the semiconductor chip. The mirror layer can be in an electrically conducting or electrically insulating form.

The radiation exit surface is preferably formed by the main surface of the carrier, which faces away from the epitaxial semiconductor layer sequence. Particularly preferably, two contact structures are arranged on the main surface of the semiconductor chip opposite to the radiation exit surface, by means of which contact structures the semiconductor chip can be electrically contacted. A semiconductor chip of this type is also referred to as a flip-chip.

The carrier is particularly preferably formed to be transmissive for electromagnetic radiation which is generated by the active zone. Furthermore, the carrier can simultaneously be a growth substrate for the epitaxial semiconductor layer sequence. For example, the carrier comprises sapphire or is formed from sapphire. Sapphire is suitable in particular as a growth substrate for a nitride-based semiconductor layer sequence.

For the electrical contacting of the n-conducting semiconductor layer, the semiconductor chip preferably comprises links, which extend in a vertical direction, i.e., along the lateral flanks of the semiconductor chip, from the contact structures to the n-conducting semiconductor layer. Each link preferably has an electrically insulating outer layer and an electrically conductive inner layer.

According to one embodiment of the semiconductor component, the second conversion layer has been applied directly on to the radiation exit surface of the semiconductor chip and directly on to the first conversion layer. Preferably, the first conversion layer is flush with the radiation exit surface of the semiconductor chip.

According to a further embodiment of the semiconductor component, two contact structures are arranged on its main surface opposite to the radiation exit surface, via which the semiconductor chips can be electrically contacted. Particularly preferably, the contact structures are expanded by additional metallic structures. The metallic structures preferably extend to the lateral flanks of the semiconductor chip along the main surface of the semiconductor chip opposite to the radiation exit surface.

According to a further embodiment of the semiconductor component, a reflective layer is arranged on the lateral flank of the semiconductor chip. The reflective layer preferably borders the main surface of the semiconductor chip, which is opposite to the radiation exit surface. Particularly preferably, the reflective layer covers only a part of the lateral flank of the semiconductor chip, while a further part of the lateral flank of the semiconductor chip is covered by the first conversion layer. For example, the lateral flank is completely covered by the reflective layer and the first conversion layer together.

For example, the reflective layer is formed from a resin into which reflective particles, such as titanium dioxide particles, have been introduced. The resin can be, e.g., a silicone.

According to a further embodiment of the semiconductor component, the first conversion layer is formed from a resin into which phosphor particles have been introduced, wherein the concentration of the phosphor particles exhibits a gradient along the lateral flank of the semiconductor chip.

The semiconductor component is preferably a light-emitting diode.

Embodiments and features which are described here only in connection with the method can likewise be configured on the semiconductor chip and vice versa.

BRIEF DESCRIPTION OF THE DRAWINGS

Further advantageous embodiments and developments of the invention result from the exemplary embodiments described below in conjunction with the figures.

By means of the sectional diagrams of FIGS. 1 to 4, a first exemplary embodiment of a method is described.

Figure 6:
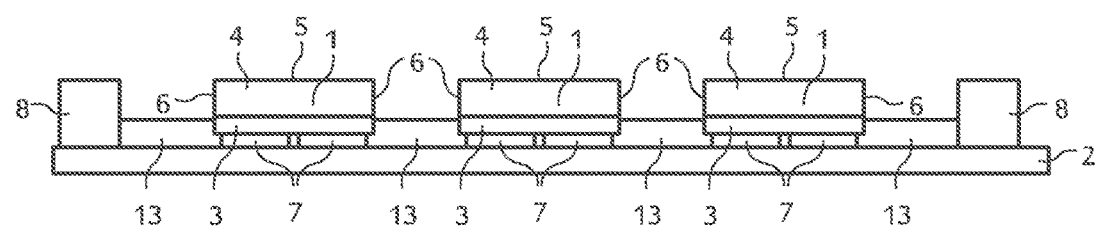
Figure 7:
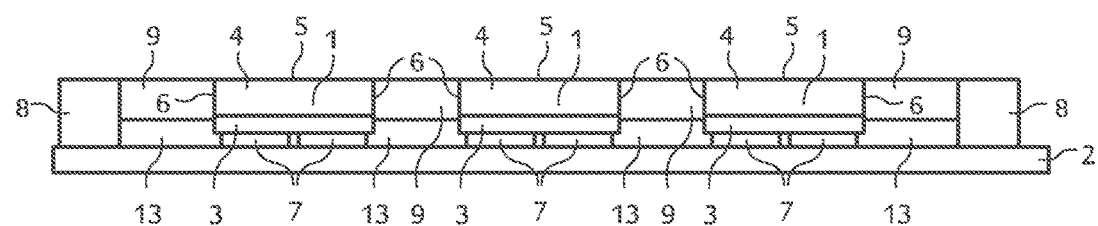
Figure 8:
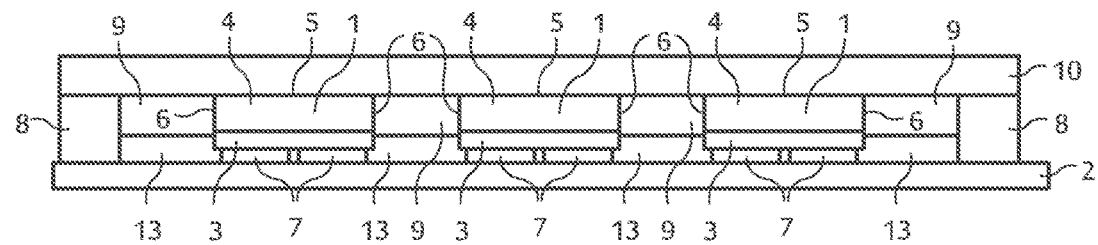

By means of the sectional diagrams of FIGS. 6 to 8, a further exemplary embodiment of a method is described.

Figure 9:
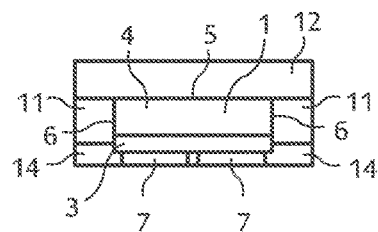

FIG. 9 shows a schematic sectional diagram of a semiconductor component according to an exemplary embodiment.

Figure 10:
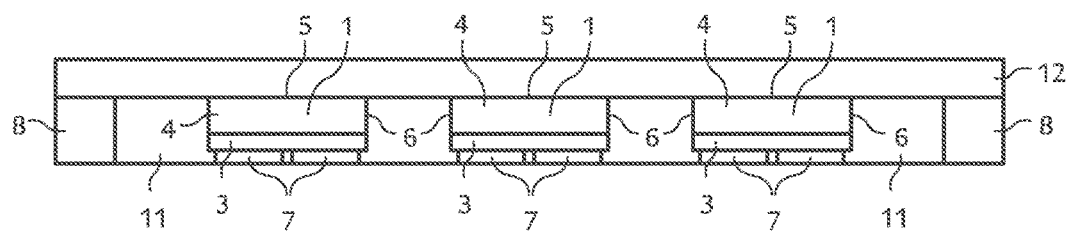
Figure 11:
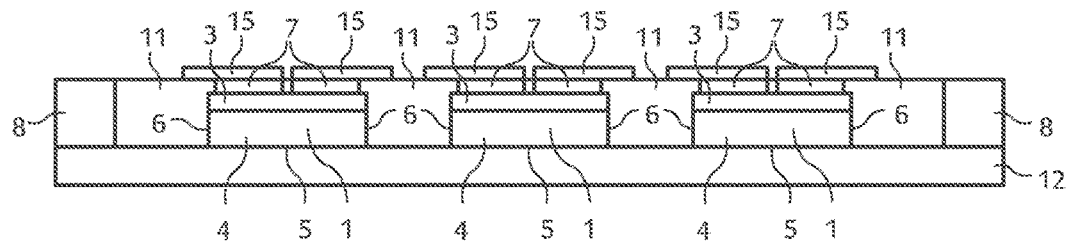

By means of the sectional diagrams of FIGS. 10 to 11 a further exemplary embodiment of a method is described.

Figure 12:
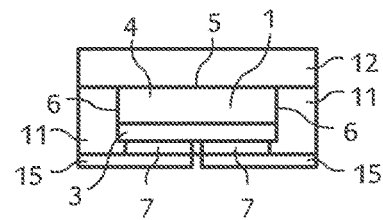

FIG. 12 shows a sectional diagram of a semiconductor component according to an exemplary embodiment.

Figure 13:
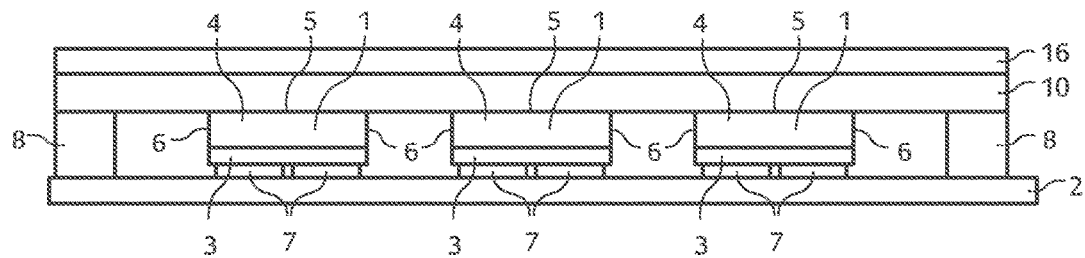
Figure 14:
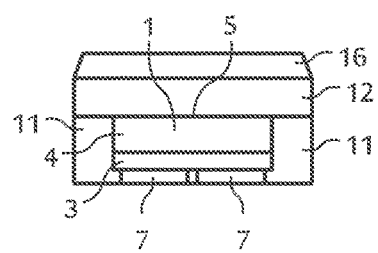

By means of the sectional diagrams of FIGS. 13 to 14 a further exemplary embodiment of a method is described.

Figure 15:
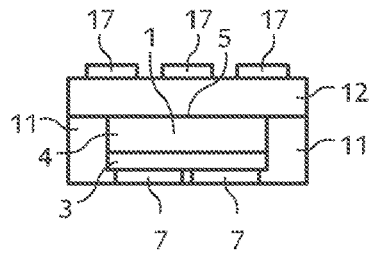

FIG. 15 shows a sectional diagram of a semiconductor component according to an exemplary embodiment.

By means of the sectional diagrams of FIGS. 16 and 17, a simulation according to an exemplary embodiment for determining the phosphor concentration in one of the two conversion layers is explained in more detail.

FIGS. 18 to 22 show exemplary simulation results.

Like, identical or similar elements or elements having the same effect are provided with the same reference numbers in the figures. The figures and the size ratios to one another of the elements illustrated in the figures should not be considered as being to scale. Rather, to illustrate them better and/or to make them easier to understand, the size of individual elements, in particular layer thicknesses, may be exaggerated.

DETAILED DESCRIPTION OF ILLUSTRATIVE EMBODIMENTS

In the method according to the exemplary embodiment of FIGS. 1 to 4, a plurality of semiconductor chips 1 are applied onto an auxiliary carrier 2 (FIG. 1). The semiconductor chips 1 comprise an epitaxial semiconductor layer sequence 3, which is applied onto a carrier 4. The epitaxial semiconductor layer sequence 3 comprises an active zone which generates electromagnetic radiation, in the present case blue light, during operation of the semiconductor chip 1.

The carrier 4 is configured to be radiation-transmissive, in particular for the light from the active zone. The carrier 4 is formed, e.g., from sapphire. The light that is generated in the active zone is emitted from a radiation exit surface 5 of the semiconductor chip 1, which is formed by a main surface of the carrier 4. Furthermore, light is also coupled out of the semiconductor chip from lateral flanks 6 of the carrier 4. The light from the active zone passes through the carrier 4 to its radiation exit surface 5 or to its lateral flanks 6 (see the arrows in FIG. 1).

On the main surface of the epitaxial semiconductor layer sequence 3, which faces away from the carrier 4, two contact structures 7 are applied, which are intended for the electrical contacting of the semiconductor chip 1.

In a next step, which is illustrated diagrammatically in FIG. 2, a barrier 8 is applied in an outer region of the auxiliary carrier 2. The barrier 8 in the present case is in an annular form and forms a closed contour around the semiconductor chips 1. The barrier in the exemplary embodiment of FIG. 2 is formed from silicone.

A first conversion material 9 is then introduced into the interstices between the semiconductor chips 1 and between the outermost semiconductor chip 1 and the barrier 8 (FIG. 3), e.g., by jetting or dispensing. The first conversion material 9 here is present as a liquid resin into which phosphor particles (not illustrated) have been introduced. The barrier 8 here prevents the first conversion material 9 from flowing off the auxiliary carrier 2. The first conversion material 9 extends as far as the radiation exit surface 5 of the semiconductor chips 1 and is flush with the radiation exit surface 5 of the semiconductor chips 1.

The phosphor particles of the first conversion material 9 are suitable for converting radiation from the semiconductor chip 1 of the first wavelength range into electromagnetic radiation of a second wavelength range. The second wavelength range in the present exemplary embodiment is yellow light.

Figure 4:
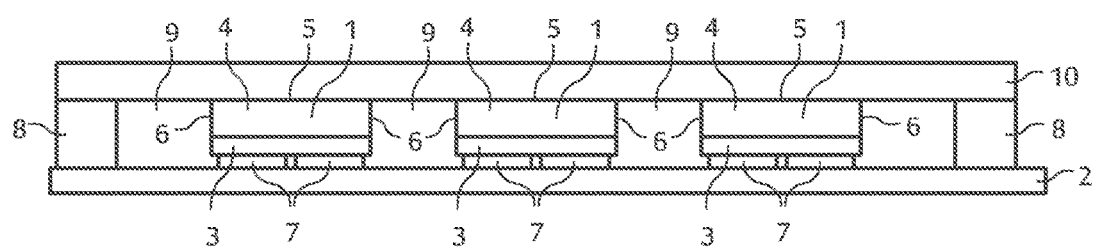

In a next step, a second conversion material 10 is applied, which is suitable for at least partially converting radiation from the semiconductor chip 1 to another electromagnetic radiation (FIG. 4). For example, the second conversion material 10 also converts radiation from the semiconductor chip 1 to radiation of the second wavelength range. Furthermore, however, it is also possible that the second conversion material 10 converts the radiation from the semiconductor chip 1 to a third wavelength range which differs from that of the first and second wavelength ranges.

The second conversion material 10 here is applied over the entire surface of the composite composed of auxiliary carrier 2, semiconductor chips 1 and first conversion material 9. For example, the second conversion material 10 can be applied in liquid form by spray-coating. The second conversion material 10 here is present as a liquid resin into which phosphor particles have been introduced. The phosphor particles impart the wavelength-converting properties to the second conversion material 10.

Next, the resin of the first conversion material 9 and of the second conversion material 10 is cured and the auxiliary carrier 2 is removed. Finally, the semiconductor components are singulated, wherein the first conversion material 9 forms a first conversion layer 11 on the lateral flanks 6 of the semiconductor chip 1 and the second conversion material 10 forms a second conversion layer 12 on the radiation exit surface 5 of the semiconductor chip 1 (FIG. 5).

Alternatively, it is also possible that the second conversion material 10 is present as a conversion film, which is laminated on to the composite composed of first conversion material 11 and semiconductor chips 1. Before laminating the conversion film, the resin of the first conversion material 9 is cured. In this embodiment too, the auxiliary carrier 2 is removed and the semiconductor components singulated, wherein the first conversion material 9 forms a first conversion layer 11 on the lateral flanks 6 of the semiconductor chip 1 and the second conversion material 10 forms a second conversion layer 12 on the radiation exit surface 5 of the semiconductor chip 1.

Figure 5:
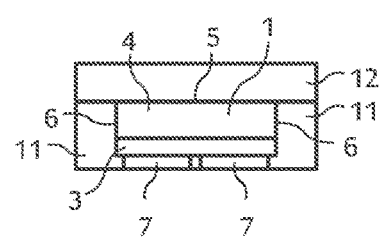
FIG. 5 shows a sectional diagram of a semiconductor component according to an exemplary embodiment.

The schematic sectional diagram of FIG. 5 shows a semiconductor component according to a first exemplary embodiment, as can be produced by the method according to the exemplary embodiment of FIGS. 1 to 4. The semiconductor component according to the exemplary embodiment of FIG. 5 comprises a semiconductor chip 1, on the radiation exit surface 5 of which the second conversion layer 12 is applied in direct contact therewith. The second conversion layer 12 projects laterally beyond the radiation exit surface 5 of the semiconductor chip 1 and covers the first conversion layer 11, which extends along the lateral flanks 6 of the semiconductor chip 1 to the contact structures 7.

Electromagnetic radiation which is generated in the active zone of the semiconductor chip 1 passes through the carrier 2 at least partially and is coupled out of the semiconductor chip 1 via the lateral flanks 6 of the carrier 2 or via its radiation exit surface 5. This outcoupled electromagnetic radiation then passes through the first conversion layer 11 or the second conversion layer 12 and is at least partially converted there to radiation of another wavelength range. Particularly preferably, the conversion layers 11, 12 are formed such that they convert part of the blue light from the active zone to yellow light, so that the entire semiconductor component emits white light.

In the method according to the exemplary embodiment of FIGS. 6 to 8, in contrast to the method according to FIGS. 1 to 4, before applying the first conversion material 9 a reflective material 13 is applied into the interstices between the semiconductor chips 1 on the auxiliary carrier 2. The reflective material 13 here is likewise initially configured in liquid form. It is formed from a resin into which reflective particles have been introduced. The reflective material 13 can also be introduced into the interstices, e.g., by dispensing or pouring (see FIG. 6).

In a next step, which is illustrated schematically in FIG. 7, the first conversion material 9 is then applied in liquid form onto the reflective material 13. Particularly preferably here, the reflective material 13 is cured before applying the first conversion material 9.

A second conversion material 10 is then applied onto the first conversion material 9 and the semiconductor chips 1, as already described by means of FIG. 4 (FIG. 7).

Finally, the auxiliary carrier 2 is removed and the semiconductor components are singulated (not illustrated).

In the method according to the exemplary embodiment of FIGS. 6 to 8, a semiconductor component as illustrated diagrammatically, e.g., in FIG. 9 can be produced.

In contrast to the semiconductor component according to the exemplary embodiment of FIG. 5, the semiconductor component according to the exemplary embodiment of FIG. 9 comprises a reflective layer 14, which partially covers the lateral flanks 6 of the semiconductor chip 1. The reflective layer 14 is arranged on the region of the lateral flanks 6 of the semiconductor chip 1 which borders the contact structures 7.

The first conversion layer 11, which is flush with the radiation exit surface 5 of the semiconductor chip 1, has been applied onto the reflective layer 14 in direct contact therewith. The second conversion layer 12 has in turn been applied on to the first conversion layer 11 and the radiation exit surface 5 of the semiconductor chip 1, as already described with the aid of FIG. 5.

In the method according to the exemplary embodiment of FIGS. 10 and 11, the method steps as already described with the aid of FIGS. 1 to 4 are initially carried out. The resin of the conversion layers 11, 12 is then cured and the auxiliary carrier 2 removed (FIG. 10). Metallic structures 15 are then applied on to the main surface of the composite composed of first conversion layer 11 and semiconductor chip 1, which is exposed by removing the auxiliary carrier 2, on to the contact structures 7 (FIG. 11). The metallic structures 15 here expand the contact structures 7 laterally.

The semiconductor component according to the exemplary embodiment of FIG. 12 can be produced, e.g., by the method as described with the aid of FIGS. 10 and 11. In contrast to the semiconductor component as already described with the aid of FIG. 5, in the semiconductor component according to FIG. 12, a metallic structure 15 is arranged on each contact structure 7, which in each case projects laterally beyond the semiconductor chip 1 and extends to a side surface of the semiconductor component. With the aid of the metallic structures 15, better electrical contacting of the semiconductor chip 1 is possible.

FIG. 13 shows in diagrammatic form a method step as can be carried out, e.g., by the method step as already described with the aid of FIG. 4. In the method step according to the exemplary embodiment of FIG. 13, on the cured second conversion material 10, a translucent layer 16 is applied over the entire surface. The translucent layer 16 is formed, e.g., from silicone or glass. In a next step, the semiconductor components are singulated, wherein, for example, the lateral flanks of the translucent layer 16 are beveled using an appropriate saw blade (FIG. 14). The translucent layer 16 with the beveled side surfaces improves the outcoupling of light from the finished semiconductor component.

The semiconductor component according to the exemplary embodiment of FIG. 15, in contrast to the semiconductor component according to FIG. 5, comprises outcoupling structures 17, which are placed on the second conversion layer 12. The outcoupling structures 17 likewise improve the outcoupling of light from the semiconductor component.

FIG. 16 shows a schematic diagram of a device on which the simulation to determine the concentration of phosphor particles in the first conversion layer 11 and second conversion layer 12 can be based.

The device according to the exemplary embodiment of FIG. 16 comprises a reflective base plate 18 with a reflectance of R=0.95. A semiconductor chip 1 with edge lengths of 1 mm² each is applied on the base plate 18. The semiconductor chip 1 is a flip-chip.

A high-refractive index (HRI) lens 19 is arranged over the semiconductor chip 1. In each of two corners of the base plate, an electrical connection point 20 is formed which in the present case comprises or is formed from gold.

A flip-chip like that on which the simulation is based is illustrated schematically in FIG. 17. The flip-chip comprises a carrier 4 composed of sapphire with a thickness of about 115 micrometers. Furthermore, the epitaxial semiconductor layer sequence 3 of the semiconductor chip comprises an n-conducting GaN layer 21 and a p-conducting GaN layer 22 with a refractive index of about 2.5 in each case. The absorption coefficient of the n-conducting GaN layer 21 is assumed to be 1/cm and the absorption coefficient of the p-conducting GaN layer 22 is assumed to be 30/cm.

Within the epitaxial semiconductor layer sequence 3, mallets 23, which comprise an inner electrically conductive layer and an outer electrically insulating layer, are provided for electrical contracting. The electrically insulating layer can comprise or be formed from, e.g., one of the following materials: silicon oxide, silicon nitride. The electrically conductive layer can comprise or be formed from, e.g., one of the following materials: titanium, silver.

On the epitaxial semiconductor layer sequence 3 a mirror layer (not illustrated) is arranged. The mirror layer in the simulation has a reflectance of approximately 0.97. The mirror layer can be designed to be electrically conducting or electrically insulating.

Finally, the contact structures 7 are formed, e.g., from silver and have a reflectance of about 0.9.

In the simulation, a fixed color temperature is initially preset for the mixed-colored light which the semiconductor component is intended to emit, and which is composed of unconverted electromagnetic radiation from the semiconductor chip and converted radiation from the conversion layers. For example, the color temperature of the mixed-colored light in the simulation is 6000 K.

The thickness of the first conversion layer 11 and the thickness of the second conversion layer 12 are each set at, e.g., 50 micrometers, while the concentration of phosphor particles in the second conversion layer 12 is variable. In both conversion layers 11, 12, a garnet phosphor such as YAG:Ce, for example, is used as a phosphor.

Now, during a first simulation the concentration of the phosphor particles in the first conversion layer 11 is kept constant and the concentration of phosphor particles in the second conversion layer 12 is determined iteratively for a color temperature of 6000 K. The simulation is repeated for various concentrations of phosphor particles in the second conversion layer 12, namely $c_0=0$ wt. %, $c_1=10$ wt. %, $c_2=20$ wt. %, $c_3=30$ wt. %, $c_4=40$ wt. %, $c_5=50$ wt. % and $c_6=60$ wt. %.

FIG. 18 shows, as a result of the simulation, the luminous intensity $I_v$ as a function of the solid angle $\Omega$ at various concentrations of phosphor in the first conversion layer 11. The concentrations of phosphor particles in the first conversion layer 11 are: in the curve $I_0$ 0 wt. %, in the curve $I_1$ 10 wt. %, in the curve $I_2$ 20 wt. %, in the curve $I_3$ 30 wt. %, in the curve $I_4$ 40 wt. %, in the curve $I_5$ 50 wt. % and in the curve $I_6$ 60 wt. %. The average full width at half maximum (FWHM) of the curves $I_0$ to $I_6$ is approximately 155°.

Figure 19:
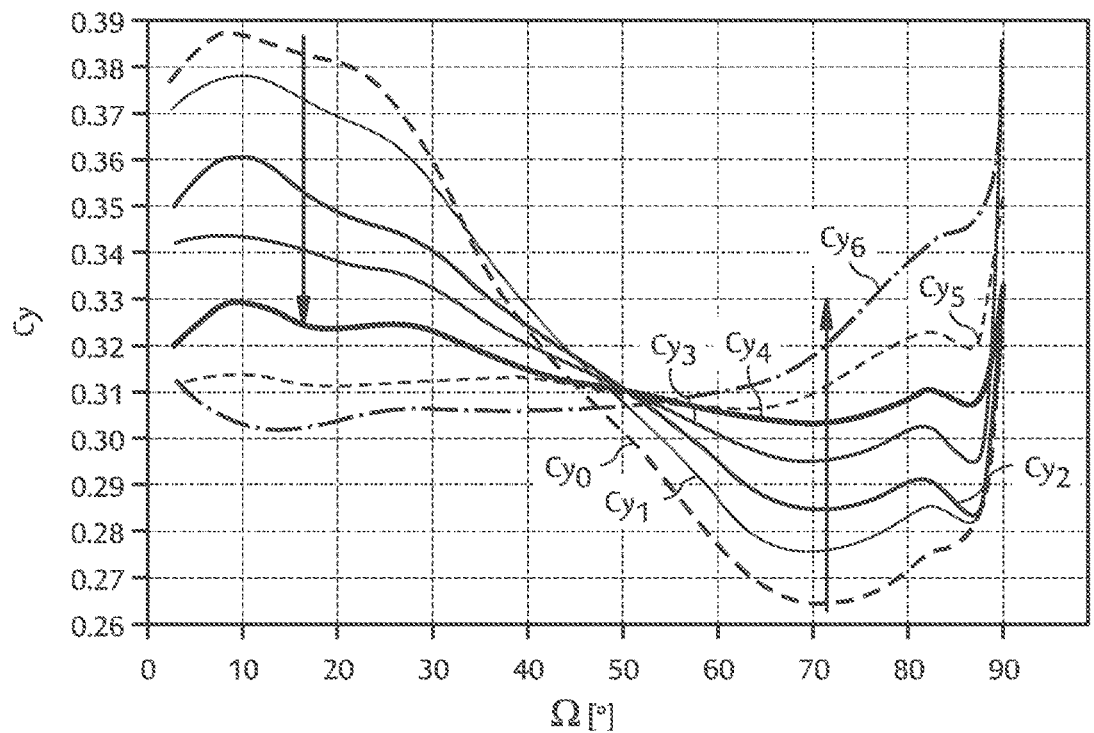

FIG. 19 shows the simulation results for the color coordinate $C_Y$ as a function of the angle $\Omega$. The curves are again determined assuming various concentrations of phosphor in the first conversion layer 11. The concentrations of phosphor particles in the first conversion layer 11 are: in the curve $C_{y0}$ 0 wt. %, in the curve $C_{y1}$ 10 wt. %, in the curve $C_{y2}$ 20 wt. %, in the curve $C_{y3}$ 30 wt. %, in the curve $C_{y4}$ 40 wt. %, in the curve $C_{y5}$ 50 wt. % and in the curve $C_{y6}$ 60 wt. %. The simulation shows that, as the concentration of phosphor particles in the first conversion layer 11 increases, a blue ring in an outer region of the emission cone of the mixed-colored light as well as a yellowish center of the emission cone of the mixed-colored light become smaller (see arrows). At a concentration of phosphor particles of between 50% and 60%, the semiconductor component according to the simulation exhibits an optimized color impression across the solid angle.

Figure 20:
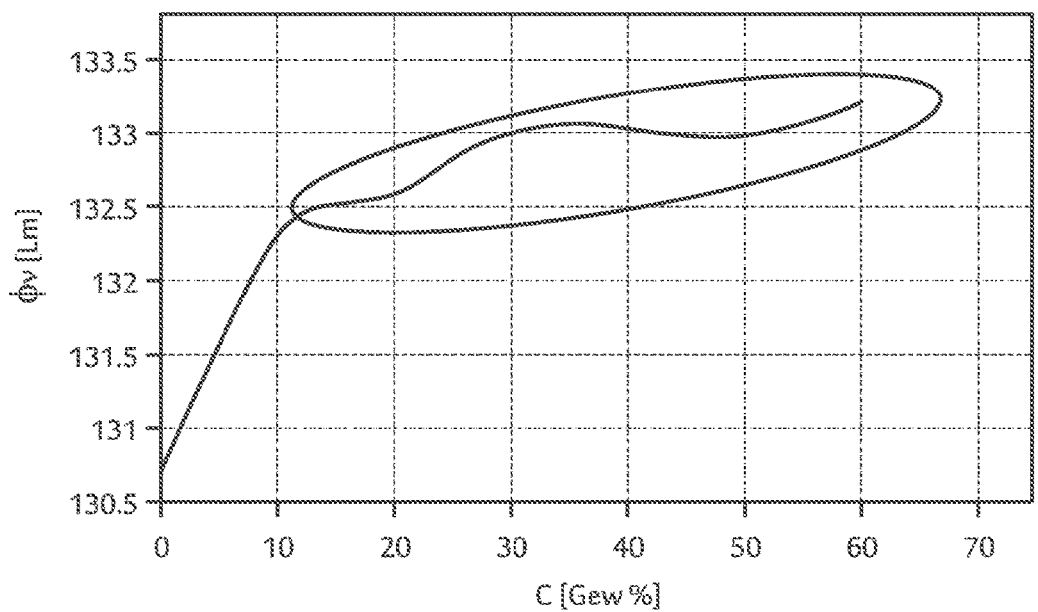

FIG. 20 shows a simulation result of the luminous flux $\Phi_v$ at a color temperature of 6000 K as a function of the concentration of phosphor particles c in the first conversion layer 11. FIG. 20 shows that the efficiency of the semiconductor component is better if the lateral flanks 6 of the semiconductor chip 1 are covered with phosphor particles. The efficiency is increased by approximately 2%.

Figure 21:
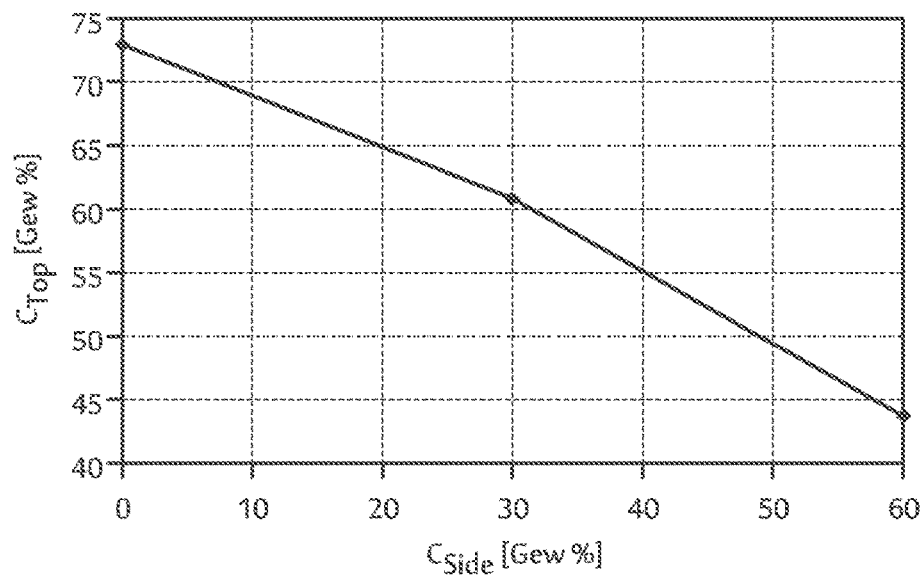

FIG. 21 shows the concentration $C_{top}$ of phosphor particles in the second conversion layer 12 on the radiation exit surface 5 of the semiconductor chip 1 as a function of the concentration $C_{side}$ of phosphor particles in the first conversion layer 11 on the lateral flank 6 of the semiconductor chip 1 for a preset color temperature of the mixed-colored light emitted by the semiconductor component of 6000 K.

Figure 22:
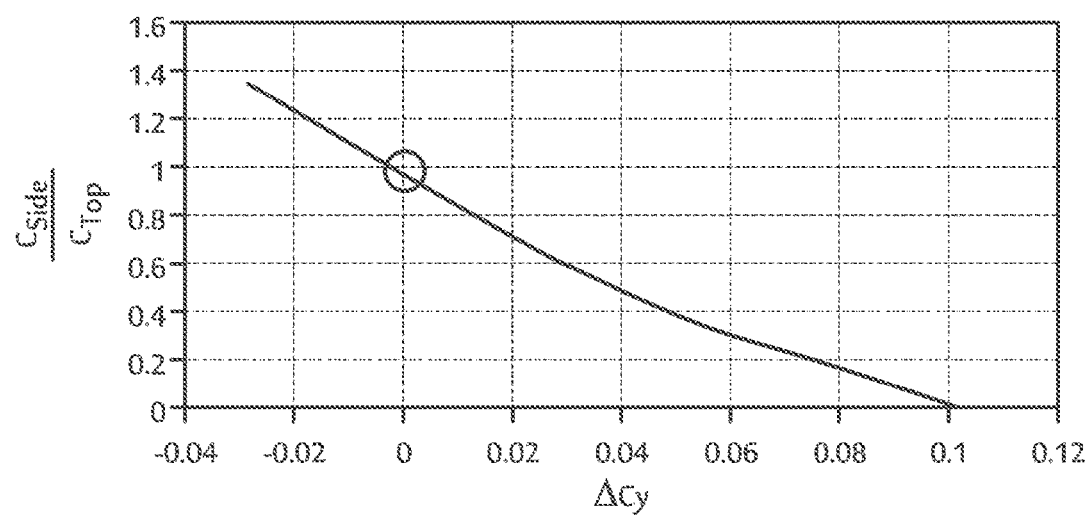

FIG. 22 shows the ratio of the concentration of phosphor particles in the first conversion layer to the concentration of phosphor particles in the second conversion layer $C_{side}/C_{top}$ as a function of the color coordinate $\Delta C_Y$. The color coordinate $\Delta C_Y$ is the difference between the color coordinate $C_Y$ at 0° and the color coordinate at 85". In other words, the value $\Delta C_Y$ is a measure of the dependence of the color location on angle.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

The invention claimed is:

1. A method for producing a plurality of optoelectronic semiconductor components the method comprising:
   applying a plurality of semiconductor chips, which emit electromagnetic radiation of a first wavelength range from a radiation exit surface during operation, onto an auxiliary carrier;
   applying a first conversion material into interstices between the semiconductor chips, wherein the first conversion material is suitable for converting electromagnetic radiation of the first wavelength range into electromagnetic radiation of a second wavelength range;
   applying a second conversion material over the first conversion material, wherein the second conversion material is suitable for converting electromagnetic radiation of the first wavelength range into electromagnetic radiation of a second wavelength range or of a third wavelength range;
   removing the auxiliary carrier; and
   singulating the semiconductor components, wherein the first conversion material forms a first conversion layer on lateral flanks of the semiconductor chips and the second conversion material forms a second conversion layer on the radiation exit surface of the semiconductor chips,
   wherein the first conversion material and the second conversion material are a first liquid resin and a second liquid resin into which phosphor particles have been introduced,
   wherein the phosphor particles from the second liquid resin sediment into the first liquid resin,
   wherein the first liquid resin and second liquid resin are cured before a singulation process, and
   wherein, before applying the first conversion material, a reflective material is applied into the interstices between the semiconductor chips.

2. The method according to claim 1, further comprising, before applying the first conversion material, applying a barrier around the semiconductor chips in a marginal region of the auxiliary carrier.

3. The method according to claim 1, wherein removing the auxiliary carrier comprising removing the auxiliary carrier so that a back contact structure of the semiconductor chips is freely accessible and so that the contact structure is laterally expanded by applying a metallic structure.

4. The method according to claim 3, wherein the metallic structure is printed or applied using photolithography.

5. The method according to claim 1, further comprising placing geometric outcoupling structures onto a main surface of the second conversion layer facing away from the radiation exit surfaces of the semiconductor chips.

6. The method according to claim 1, further comprising applying a translucent layer onto the second conversion layer, wherein lateral flanks of the translucent layer are structured by the singulation process.

7. The method according to claim 1, further comprising determining in a simulation a concentration of phosphor particles in the first conversion material and a concentration of phosphor particles in the second conversion material.

8. The method according to claim 7, wherein determining in the simulation comprises:
   defining a color temperature of the electromagnetic radiation of the semiconductor component;
   defining the concentration of phosphor particles in the first conversion material; and
   determining the concentration of phosphor particles in the second conversion material using the color temperature and the concentration of phosphor particles in the first conversion material.

9. A semiconductor component manufactured by the method of claim 1, comprising:
   a semiconductor chip configured to emit electromagnetic radiation of a first wavelength range from a radiation exit surface;
   a first conversion layer located on a lateral flank of the semiconductor chip, wherein the first conversion layer is suitable for converting electromagnetic radiation of the first wavelength range into electromagnetic radiation of a second wavelength range; and
   a second conversion layer located on a radiation exit surface of the semiconductor chip, wherein the second conversion layer is suitable for converting electromagnetic radiation of the first wavelength range into electromagnetic radiation of the second or of a third wavelength range, wherein the first conversion layer differs from the second conversion layer, wherein the first conversion layer is a resin comprising phosphor particles, and wherein a concentration of the phosphor particles exhibits a gradient along the lateral flank of the semiconductor chip.

10. The semiconductor component according to claim 9, wherein the semiconductor chip comprises a carrier and an epitaxial semiconductor layer sequence located thereon, wherein the epitaxial layer sequence comprises an active zone configured to generate electromagnetic radiation of the first wavelength range during operation, and wherein the semiconductor chip comprises a radiation exit surface formed by the main surface of the carrier, and wherein the radiation exist surface faces away from the epitaxial semiconductor layer sequence.

11. The semiconductor component according to claim 9, wherein the first conversion layer and the second conversion layer have different concentrations of phosphor particles.

12. The semiconductor component according to claim 9, wherein the second conversion layer is located directly on the radiation exit surface of the semiconductor chip and directly on the first conversion layer.

13. The semiconductor component according to claim 9, wherein two contact structures are arranged on a main surface opposite to the radiation exit surface, wherein the two contact structures are expanded by further metallic structures, and wherein the metallic structures extend to a side surface of the semiconductor component.

14. The semiconductor component according to claim 9, wherein a reflective layer is arranged on the lateral flank of the semiconductor chip, and wherein the reflective layer borders the main surface of the semiconductor chip opposite to the radiation exit surface.

15. The semiconductor component according to claim 14, wherein the reflective layer comprises a resin into which reflective particles have been introduced.

16. A method for producing a plurality of optoelectronic semiconductor components the method comprising:

applying a plurality of semiconductor chips, which emit electromagnetic radiation of a first wavelength range from a radiation exit surface during operation, onto an auxiliary carrier, applying a first conversion material into interstices between the semiconductor chips, wherein the first conversion material is suitable for converting electromagnetic radiation of the first wavelength range into electromagnetic radiation of a second wavelength range, applying a second conversion material over the first conversion material, wherein the second conversion material is suitable for converting electromagnetic radiation of the first wavelength range into electromagnetic radiation of a second wavelength range or of a third wavelength range, removing the auxiliary carrier and singulating the semiconductor components, wherein the first conversion material forms a first conversion layer on the lateral flanks of the semiconductor chip and the second conversion material forms a second conversion layer on the radiation exit surface of the semiconductor chip, wherein the first conversion material is a first liquid resin and the second conversion material is a second liquid resin into which phosphor particles have been introduced, and wherein the phosphor particles from the second liquid resin sediment into the first liquid resin, wherein the first liquid resin and second liquid resin are cured before singulation, and wherein a concentration of phosphor particles in the first conversion material and a concentration of phosphor particles in the second conversion material is determined by a simulation.

* * * * *